(12) United States Patent
Nagaraj et al.

(10) Patent No.: US 11,247,232 B2
(45) Date of Patent: Feb. 15, 2022

(54) TRANSDUCER INTERFACE PAIR IMPEDANCE MEASUREMENT

(71) Applicant: Texas Instruments Incorporated, Dallas, TX (US)

(72) Inventors: Krishnaswamy Nagaraj, Plano, TX (US); Asif Qaiyum, Freising (DE); Baher S. Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 139 days.

(21) Appl. No.: 16/053,662

(22) Filed: Aug. 2, 2018

(65) Prior Publication Data

US 2019/0039091 A1 Feb. 7, 2019

Related U.S. Application Data

(60) Provisional application No. 62/541,188, filed on Aug. 4, 2017.

(51) Int. Cl.
  *B06B 1/02* (2006.01)
  *G01F 1/66* (2022.01)
  *H03K 17/687* (2006.01)

(52) U.S. Cl.
  CPC ............ *B06B 1/0215* (2013.01); *G01F 1/667* (2013.01); *H03K 17/687* (2013.01)

(58) Field of Classification Search
  CPC ...... B06B 1/0215; H03K 17/687; G01F 1/667
  See application file for complete search history.

(56) References Cited

U.S. PATENT DOCUMENTS

| | | | | |
|---|---|---|---|---|
| 5,502,652 A | * | 3/1996 | Hoggatt | G01F 1/662 702/136 |
| 8,624,641 B1 | * | 1/2014 | Faucher | H03K 17/162 327/112 |
| 2018/0076802 A1 | * | 3/2018 | Holzmann | H03K 5/04 |

* cited by examiner

*Primary Examiner* — Akm Zakaria
(74) *Attorney, Agent, or Firm* — Ebby Abraham; Charles A. Brill; Frank D. Cimino

(57) ABSTRACT

In described examples, a first and second driver each include a first-rail output transistor including a first terminal coupled to a first power rail and a second-rail output transistor including a first terminal coupled to a second power rail. The first-rail output transistor of each of the first and second drivers includes a second terminal coupled to a second terminal of the second-rail output transistor of an output node of each respective first and second driver. A resistive load includes a first terminal coupled to the first-driver output node and includes a second terminal coupled to the second-driver output node. A sampling circuit generates an indication of an impedance of at least one of the output transistors of the first and second drivers.

15 Claims, 7 Drawing Sheets

TRANSDUCER INTERFACE PAIR IMPEDANCE MEASUREMENT

CROSS-REFERENCE TO RELATED APPLICATION

This application claims the benefit of U.S. Provisional Patent Application No. 62/541,188, filed Aug. 4, 2017, which is incorporated herein by reference in its entirety and for all purposes.

BACKGROUND

Transducers (such as ultrasonic transducers) are increasingly used in a great diversity of applications for which sensors called upon to operate more efficiently and with greater accuracy. Various applications can include an ultrasonic transducers that can be configured as transmitters in one configuration, and configured in a receiver in another configuration. However, various electrical characteristics of the transducers can vary when the transmit and receive configurations are interchanged.

SUMMARY

In described examples, a first and second driver each include a first-rail output transistor that includes a first terminal coupled to a first power rail and a second-rail output transistor that includes a first terminal coupled to a second power rail. The first-rail output transistor of each of the first and second drivers includes a second terminal coupled to a second terminal of the second-rail output transistor of an output node of each respective first and second driver. A resistive load includes a first terminal coupled to the first-driver output node and includes a second terminal coupled to the second-driver output node. A sampling circuit generates an indication of an impedance of at least one of the output transistors of the first and second drivers.

DETAILED DESCRIPTION

Figure 1:
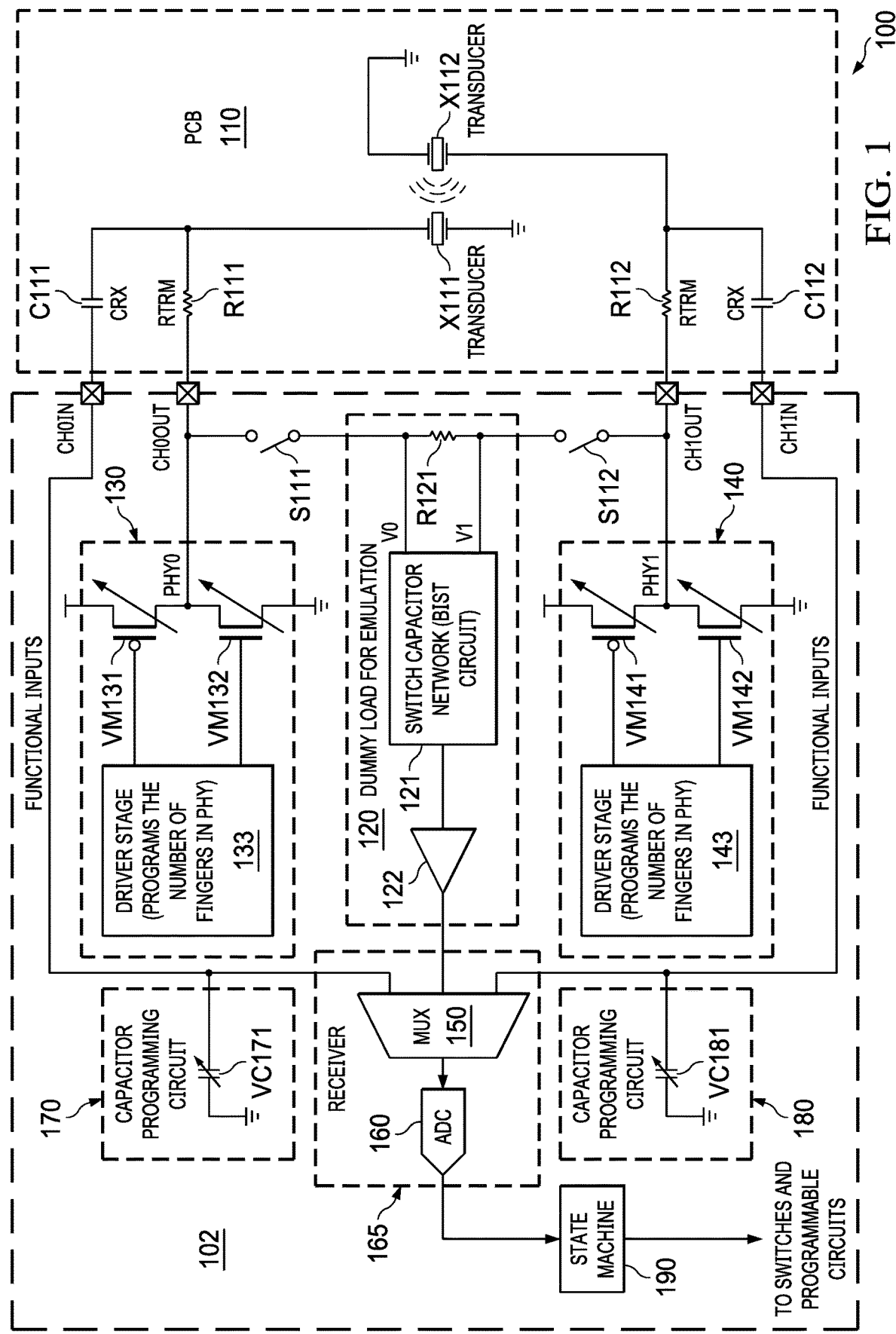
FIG. 1 is a schematic diagram of an example interchange impedance-compensated ultrasonic interface.

Example sensor interfaces can include a transmitter/receiver (TX/RX) pair. In an example ultrasonic sensing system, a first driver is arranged to excite a first transducer to transmit a signal. In response to the transmitted signal, the first transducer resonates, which produces sound waves. The sound waves are propagated through a transmission medium (e.g., such as fluid within a pipe) and are received by a second transducer, which converts the received sound waves to an input signal. The second transducer is coupled to the receiver of the TX/RX interface, which is arranged to receive the input signal for further processing.

The velocity of the transmission medium can be determined by measuring in opposite directions a time of "flight" (e.g., propagation delay) of the sound waves between transducers. For example, the velocity can be determined by: (a) measuring a time of flight of the sound waves between transducers in a first direction; (b) measuring a time of flight of the sound waves between transducers in a second direction; and (c) determining a velocity in response to the difference between the times of flight and the speed of sound propagation in the selected medium. The measurement in a first direction can be measured by arranging a first transducer as a transmitter and a second transducer as a receiver, and the measurement in a second direction can be measured by arranging the first transducer as a receiver and the second transducer as a transmitter.

Accordingly, the first and second transducers can be configured to operate as either a transmitter or a receiver. For example, the first transducer can be selectively coupled to a first driver (for transmitting) in a first configuration, and the second transducer can be selectively coupled to a second driver (for transmitting) in a second configuration. The quality of the received input signal can be degraded when the impedance characteristics of the first driver (and loads electrically coupled thereto) in the first configuration are not evenly matched with the impedance characteristics of the second driver (and loads coupled thereto) in the second configuration.

In examples described herein, the roles (e.g., transmitter and receiver roles) of the first and second transducers can be interchanged (e.g., by mutually swapping configurations between the first and second drivers) to measure (and, for example, to adjust) the impedance of a respective driver. In a first example calibration configuration, a high-side transistor from a first driver is selected to drive a dummy load for emulating the transducer pair, and a low-side transistor from a second driver is arranged to receive current sourced by the (first driver) high-side transistor via the dummy load. In a second calibration configuration, the high-side transistor from the second driver is selected to drive the dummy load for emulating the transducer pair, and a low-side transistor of the first driver is arranged to receive current sourced by the (second driver) high-side transistor via the dummy load.

Generally described, the impedance of the first and second drivers (and respective loads) can be separately determined, such that impedances the output transistors of each driver can be matched between each of the first and second configurations. For example, each driver includes high-side and low-side programmable-finger output transistors, such that the source impedance of each driver can be measured and programmed. The measurement and programming for each of the output transistors can be iterated to determine (e.g., converge upon) programming values for matching impedances between the first and second drivers. Matching impedances between the first and second drivers increases accuracies of measurements when the transmit/receive roles are interchanged between the first and second transducers.

As described hereinbelow with respect to FIG. 1, circuitry for impedance compensation of drivers for interchanged transmitter/receiver transducers can be included in an example self-calibrating system. Such a system can self-calibrate after deployment/installation, for example, to match impedances of output transistors for driving interchanged transducers. The calibration can be performed on a repeated basis, such that changes in the output transistor impedances (e.g., due to changes in operating temperatures of the output driver transistors) can be minimized over time, which increases the accuracy of the measurements of the time of flight in both directions made over time. Accordingly, impedance differences resulting from temperature fluctuations and aging can be compensated over the lifetime of the system.

FIG. 1 is a schematic diagram of an example impedance-compensated ultrasonic interface. The circuit 100 can operate in accordance with three modes: transmitting-in-a-first-direction mode, transmitting-in-a-second-direction mode, and a calibration mode. The transmitting-in-a-first-direction mode and the transmitting-in-a-second-direction mode are operational modes, whereas calibration mode is a configuration mode.

When operating in the transmitting-in-a-first-direction mode, the PHY1 driver 140 is arranged to drive pulses into the transducer X112. The PHY1 driver 140 drives impedances of components both on and off of the printed circuit board (PCB) 110. The driven PCB 110 impedances include the trimmable resistor (RTRM) R112, the receiver capacitor (CRX) C112, and the transducer X112 itself. The on-chip impedances driven by the PHY1 driver 140 include the input impedance of switch S112 (which is open when not operating in a calibration mode), a selectable input of the multiplexer (MUX) 150, the capacitor VC181, and wiring (and the terminals CH1IN and CH1OUT) between the PCB 110 and the substrate 102. In the transmitting-in-a-first-direction mode, the transducer X111 converts sound waves received from the transducer X112 to a voltage that is capacitively coupled (via capacitor C111) to the capacitor programming circuit 170 (e.g., VC171) and a selected input of the MUX 150. The receiver 165 is for receiving and digitizing the analog sound signals and includes the MUX 150 and the analog-to-digital converter (ADC) 160. The MUX 150 output is coupled to the sampling input of the ADC 160. A processor (such as state machine 190) is arranged to receive digitized values from the ADC 160, such that the transmitted signals can be read by the processor for processing and control purposes. The time of flight in the first direction can be determined by measuring the time elapsed between the activation of the PHY1 driver and the detection of the signal by the receiver.

When operating in the transmitting-in-a-second-direction mode, the PHY0 driver 130 is arranged to drive the transducer X111. The PHY0 driver 130 drives impedances of components both on and off of the PCB 110. The driven PCB 110 impedances include the trimmable resistor R111, the receiver capacitor C111, and the transducer X111 itself. The on-chip impedances driven by the PHY0 driver 130 include the input impedance of switch S111 (which is open in an operational mode), a selectable input of the MUX 150, the capacitor VC171, and wiring (including the terminals CH0IN and CH0OUT) between the PCB 110 and the substrate 102. In the transmitting-in-a-second-direction mode, the transducer X112 converts sound waves received from the transducer X111 to a voltage that is capacitively coupled (via capacitor C112) to the capacitor programming circuit 180 (e.g., VC181) and a selected input of the MUX 150. The MUX 150 output is coupled to the sampling input of the ADC 160. The processor is arranged to receive digitized values from the ADC 160, such that the transmitted signals are read by the processor. The time of flight in the second direction is determined by measuring the time elapsed between the activation of the PHY0 driver and the detection of the signal by the receiver.

In the calibration mode both the drivers are coupled to the dummy load 120 which produces signals that are coupled into an ADC 160 through the MUX 150 and buffer 122. The output of the ADC is used to measure the impedances of the drivers. Accordingly, most of the built-in self-test (BIST) components (such as an ADC and processor) are (e.g., already) provided for the operational modes. Costs of including the dummy load 120 for emulation (which includes the resistor R121 and the switched capacitor network circuit 121) are comparatively small.

In various examples where the medium of propagation is stationary and has zero flow: the difference (e.g., delta) between the time of flight in a first direction and the time of flight in an opposite direction is ideally zero. In practice, non-ideal circumstances can result in a non-zero delta, which can be referred to as a zero-flow drift (ZFD). In accordance with the description herein, ZFD measurements with a delta of a few picoseconds (e.g., <25 picoseconds) can be achieved over a range of (e.g., expected) operating temperatures.

To obtain the ZFD measurements within a delta of a few picoseconds over temperature, reciprocity of the impedance between the PHY0 and PHY1 channels is matched when the roles of TX and RX are interchanged. For example, the impedance between the PHY0 and PHY1 channels can be matched by adjusting the drive strength of respective PHY0 and PHY1 driver programmable output transistors (where PMOS transistor VM131 and NMOS transistor VM132 are programmed by driver stage 133, and where PMOS transistor VM141 and NMOS transistor VM142 are programmed by driver stage 143). As described hereinbelow with respect to FIG. 6, the PHY0 and PHY1 driver programmable output transistors each can include a number N (e.g., 30) single transistor fingers (e.g., gate fingers, and sources and drains arranged therebetween). The fingers of a programmable output transistor can be individually selected to drive a given load (where each output transistor finger can be selectively activated by a programming command generated in response to measuring an output voltage generated in response to the output transistor).

In accordance with the principle of reciprocity described hereinabove, a first PHY driver operating in a first mode (e.g., TX or RX mode) is programmed to match impedances of a second PHY driver when operating in the opposite mode (e.g., RX or TX mode, respectively). Accordingly, the impedances of the programmed transistors VM131, VM132, VM141, and VM142 are mutually equal, such that the impedance of the output of the PHY0 driver 130 during the TX mode is matched with the impedance of the output of the PHY1 driver 140 during the TX mode and the impedance of the output of the PHY0 driver 130 during the RX mode is matched with the impedance of the output of the PHY1 driver 140 during the RX mode.

Figure 2:
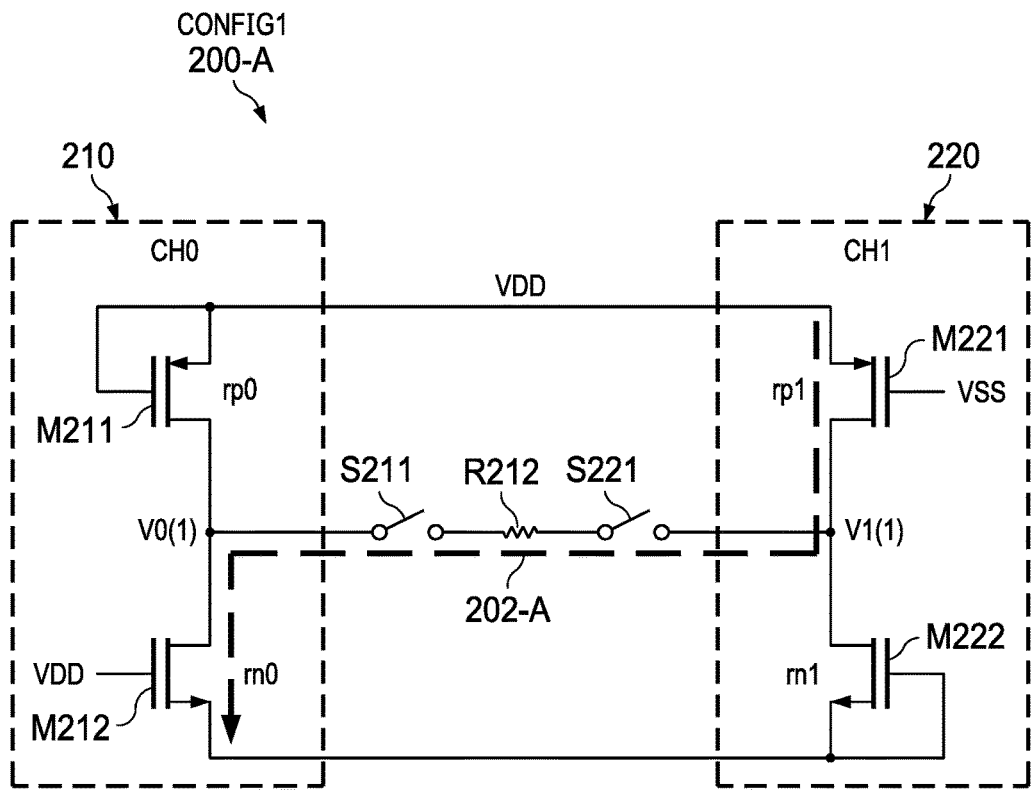
FIG. 2 is a schematic diagram of first and second calibration configurations of an example interchange impedance-compensated ultrasonic interface.
Figure 2:
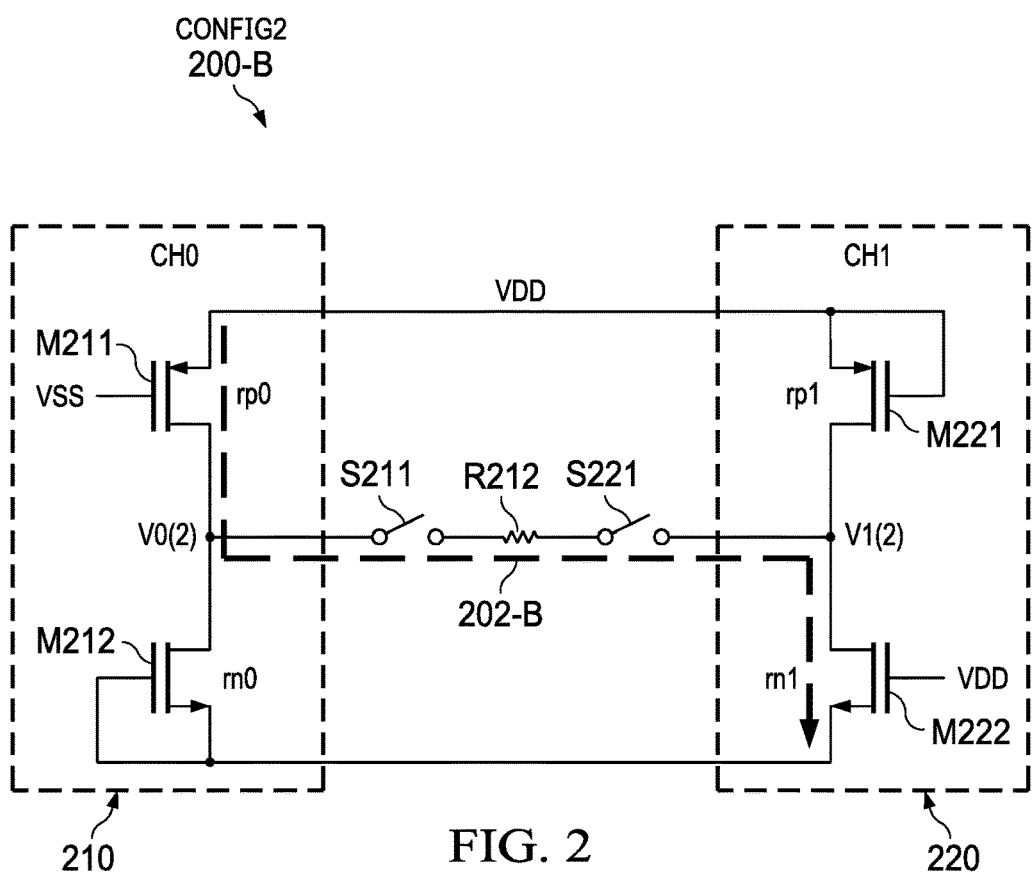

FIG. 2 is a schematic diagram of first and second calibration configurations of an example interchange impedance-compensated ultrasonic interface. For example, the impedances of both the PHY0 (channel 0) driver 210 and the PHY1 (channel 1) driver 220 can be respectively determined by measuring respective voltages generated when the two drivers are coupled by a common load (e.g., resistor R212), where a first set of voltages is generated by current flowing along a first path 202-A in a first configuration 200-A, and where a second set of voltages is generated by current flowing along a second path 202-B in a second configuration 200-B.

In the first configuration 200-A, the high-side PMOS transistor M221 of the PHY1 driver 220 is turned on (while the low-side NMOS transistor M222 of the PHY1 driver 220 is turned off). Also in the first configuration 200-A, the low-side NMOS transistor M212 of the PHY0 driver 210 is turned on (while the high-side PMOS transistor M212 of the PHY0 driver 210 is turned off). Switches S211 and S221 are closed to couple the load resistor R212 between the respective output terminals (e.g., drains) of the transistors M221 and M212, which establishes the first path 202-A (e.g., also in response to the activated states of transistors M221 and M212).

In the second configuration 200-B, the high-side PMOS transistor M211 of the PHY0 driver 210 is turned on (while the low-side NMOS transistor M212 of the PHY0 driver 210 is turned off). Also in the second configuration 200-B, the low-side NMOS transistor M222 of the PHY1 driver 220 is turned on (while the high-side PMOS transistor M222 of the PHY1 driver 220 is turned off). Switches S211 and S221 are closed to couple the load resistor R212 between the respective drains of the transistors M211 and M222, which establishes the second path 202-B (e.g., also in response to the activated states of transistors M211 and M222).

Accordingly, the impedance of the high-side PMOS transistor M221 of the PHY0 driver 210 and the low-side NMOS transistor M212 of the PHY1 driver 220 can be determined by measuring a voltage developed in response to the load resistor R212 in the first configuration 200-A. Likewise, the impedance of the high-side PMOS transistor M211 of the PHY1 driver 220 and the low-side NMOS transistor M222 of the PHY0 driver 210 can be determined by measuring a voltage developed in response to the load resistor R212 in the second configuration 200-B.

Figure 3:
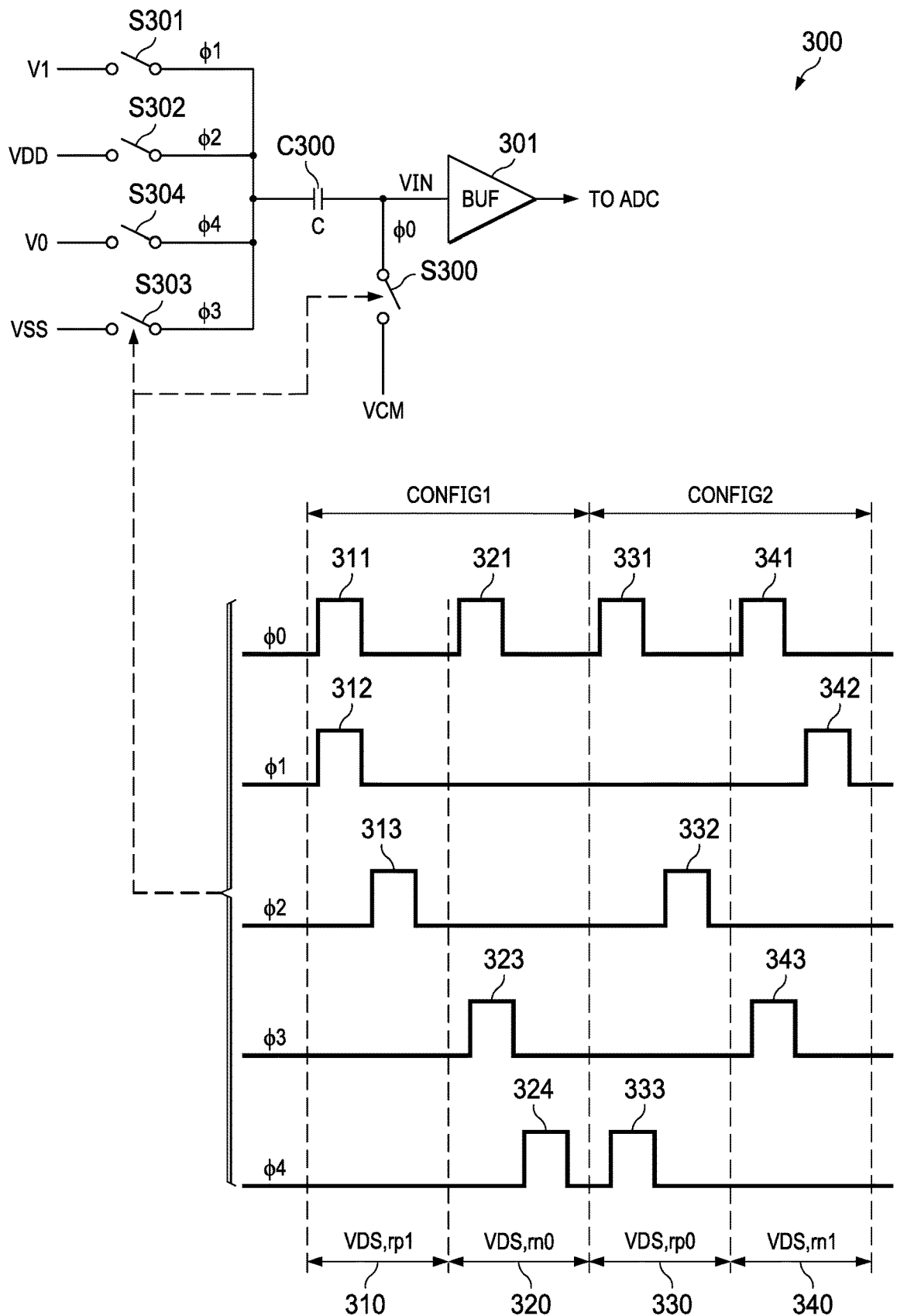
FIG. 3 is schematic diagram of example calibration configuration circuitry for measuring impedances of an example interchange impedance-compensated ultrasonic interface.

FIG. 3 is schematic diagram of example calibration configuration circuitry for measuring impedances of an example interchange impedance-compensated ultrasonic interface. The example measurement circuit 300 includes switches S301, S302, S303, S304, and S300, capacitor C300, and buffer 301, such that the circuit 300 is configurable for isolating and buffering output voltages of selected transistors. The buffer 301 is a buffer, such as buffer 122 also described hereinabove with respect to FIG. 1. The buffer 301 is coupled to an ADC (such as ADC 160) such that a processor can determine individual impedances of each output transistor of each channel and equalize the output impedances output transistors in response to the determined individual impedances.

The switches S301, S302, S303, S304, and S300 and the capacitor C300 are arranged as a switched capacitor network, such as the built-in-self-test (BIST) switched capacitor network 121 described hereinabove with respect to FIG. 1. As described hereinbelow, the example measurement circuit 300 is configurable to determine the individual impedance (e.g., output impedance) of each of the PHY0 high-side transistor, the PHY0 low-side transistor, the PHY1 high-side transistor, and the PHY1 low-side transistor.

For example, the switch S301 is responsive to the switching signal $\phi 1$ to couple the output V1 (e.g., drains) of the PHY1 to the sampling capacitor C300. The switch S302 is responsive to the switching signal $\phi 2$ to couple the supply voltage VDD (e.g., high-side supply rail) to the sampling capacitor C300. The switch S304 is responsive to the switching signal $\phi 4$ to couple the output V0 (e.g., drains) of the PHY0 to the sampling capacitor C300. The switch S303 is responsive to the switching signal $\phi 3$ to couple the ground VSS (e.g., low-side supply rail) to the sampling capacitor C300. The switch S300 is responsive to the switching signal $\phi 0$ to couple a common-mode voltage VCM (e.g., a regulated voltage between the high-side supply rail and the low-side supply rail) to the sampling capacitor C300.

The circuit 300 is configurable to measure voltages of selected nodes to determine impedances of each output transistor of each of the PHY0 and PHY1 drivers. Each transistor output can be measured during each of four time periods. The circuit 300 is arranged in a first configuration (e.g., such as configuration 200-A in which the PH1 driver high-side transistor and the PHY0 driver low-side transistors are activated, while the PH0 driver high-side transistor and the PHY1 driver low-side transistors are off) during time periods 310 and 320. The circuit is arranged in a second configuration (e.g., such as configuration 200-B in which in which the PH0 driver high-side transistor and the PHY1 driver low-side transistors are activated, while the PH1 driver high-side transistor and the PHY0 driver low-side transistors are off) during time periods 330, and 340. The time periods 310, 320, 330, and 340 need not be consecutively ordered.

During time 310, the C300 output terminal switch S300 and the C300 input terminal switch S301 are momentarily closed in response to pulses 311 and 312. Momentarily closing the switches S300 and S301 generates a first voltage VC across the capacitor C300, where the voltage of the C300 input terminal is the node V1 voltage and the voltage of the C300 output terminal is the node VCM voltage in the first calibration configuration. Accordingly, the first voltage VC (in the first calibration configuration) is the node V1 voltage minus the node VCM voltage. Subsequently, the switch S302 is closed momentarily in response to pulse 313 to couple (e.g., connect) the C300 input terminal to the voltage VDD, such that the voltage of the C300 output terminal (in the first calibration configuration) is the voltage of VDD minus the voltage of VC. The resulting voltage at C300 output terminal is buffered by the buffer 301 and is sampled by the ADC to generate a sample of the VDD-VC voltage in the first calibration configuration. As described below with reference to state 420 of FIG. 4, the voltage of the C300 output terminal (e.g., VIN) transistor in the first calibration configuration is equal to the voltage of node VCM plus the voltage drop across the PHY1 high-side (e.g., PMOS) output transistor.

During time 320, the C300 output terminal switch S300 and the C300 input terminal switch S303 are momentarily closed in response to pulses 321 and 323. Momentarily closing the switches S300 and S303 generates a second voltage VC across the capacitor C300, where the voltage of the C300 input terminal is the node VSS voltage and the voltage of the C300 output terminal is the node VCM voltage in the first calibration configuration. Accordingly, the second voltage VC (in the first calibration configuration) is the node VSS voltage minus the node VCM voltage. The switch S304 is closed momentarily in response to pulse 324 to couple the C300 input terminal to the voltage V0, such that the voltage of the C300 output terminal (in the first calibration configuration) is the voltage of node V0 minus the voltage of VC. The resulting voltage at the C300 output terminal is buffered by the buffer 301 and is sampled by the ADC to generate a sample of the V0-VC in the first calibration configuration. As described below with reference to state 440 of FIG. 4, the voltage of the C300 output terminal (e.g., VIN) transistor in the first calibration configuration is equal to the voltage of node VCM plus the voltage drop across the PHY0 low-side (e.g., NMOS) output.

During time 330, the C300 output terminal switch S300 and the C300 input terminal switch S304 are momentarily closed in response to pulses 331 and 333. Momentarily closing the switches S300 and S304 generates a first voltage VC across the capacitor C300, where the voltage of the C300 input terminal is the node V0 voltage and the voltage of the C300 output terminal is the node VCM voltage in the second calibration configuration. Accordingly, the first voltage VC (in the second calibration configuration) is the node V0 voltage minus the node VCM voltage. Subsequently, the switch S302 is closed momentarily in response to pulse 332 to couple the C300 input terminal to the voltage VDD, such that the voltage of the C300 output terminal is the node VDD minus the voltage VC in the second calibration configuration. As described below with reference to state 520 of FIG. 5, the voltage of the C300 output terminal (e.g., VIN) in the second calibration configuration is equal to the voltage of node VCM plus the voltage drop across the PHY0 high-side (e.g., PMOS) output transistor.

During time 340, the C300 output terminal switch S300 and the C300 input terminal switch S303 are momentarily closed in response to pulses 341 and 343. Momentarily closing the switches S300 and S303 generates a first voltage VC across the capacitor C300, where the voltage of the C300 input terminal is the node VSS and the voltage of the C300 output terminal is the node VCM voltage in the second calibration configuration. Accordingly, the second voltage VC (in the second calibration configuration) is the node VSS voltage minus the node VCM voltage. Subsequently, the switch S301 is closed momentarily in response to pulse 342 to couple the C300 input terminal to the voltage V1, such that the voltage of the C300 output terminal (in the second calibration configuration) is the voltage of V1 minus the voltage of VC in the second calibration configuration. The resulting voltage at the C300 output terminal is buffered by the buffer 301 and is sampled by the ADC to generate a sample of the voltage V1-VC in the second calibration configuration. As described below with reference to state 540 of FIG. 5, the voltage of the C300 output terminal (e.g., VIN) in the second calibration configuration is equal to the voltage of node VCM plus the voltage drop across the PHY1 low-side (e.g., NMOS) output transistor.

Accordingly, the voltage drain-to-source of each of the PHY1 driver high-side output transistor, the PHY0 driver low-side output transistor, the PHY0 driver high-side output transistor, and the PHY1 driver low-side transistor of the PHY1 driver in the second calibration configuration can be individually determined. Likewise, the impedance of the respective output transistor can be determined in response to the respective, individually determined voltage drain-to-source.

Figure 4:
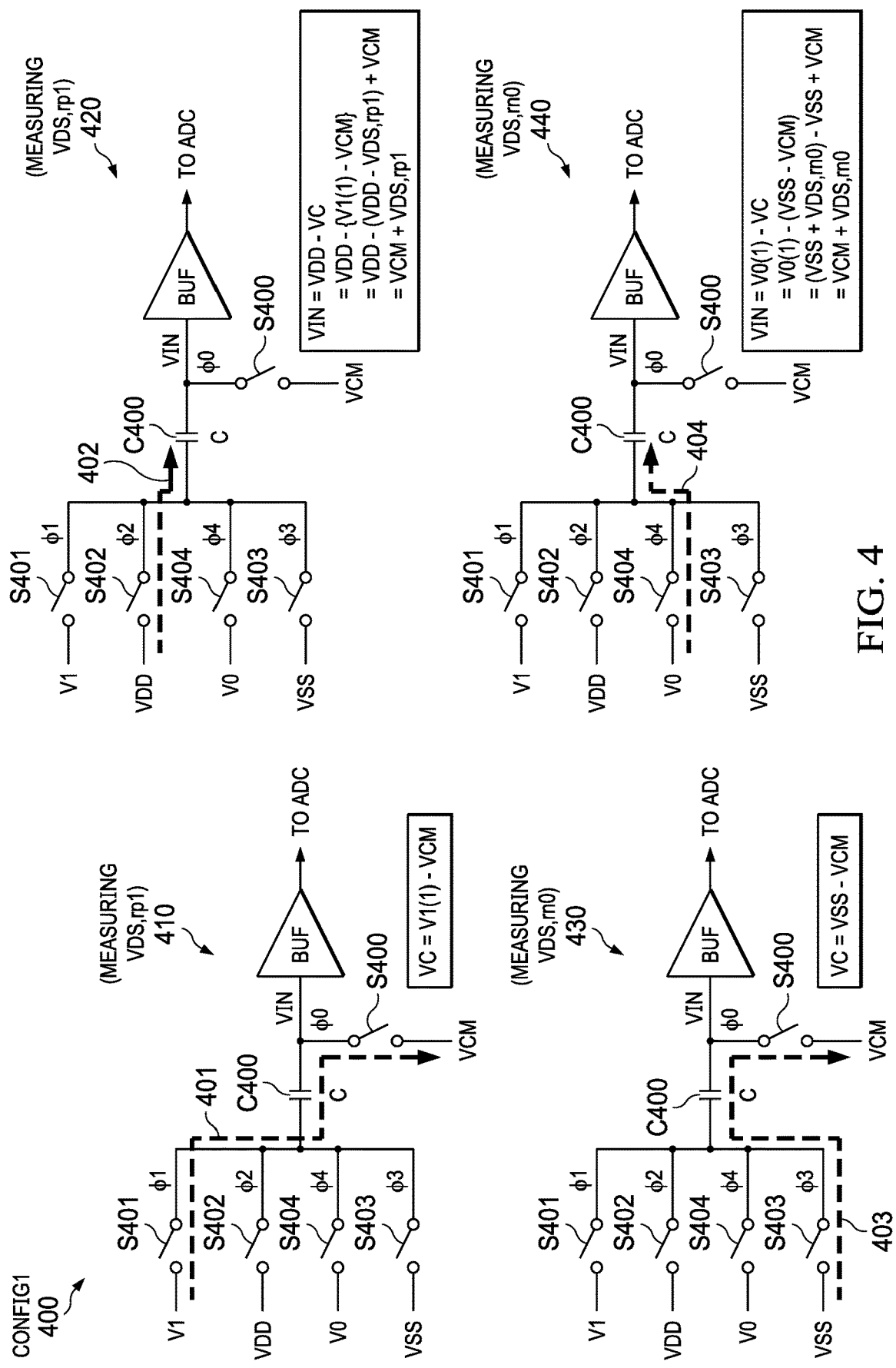
FIG. 4 is a schematic diagram of example switching sequences in a first calibration configuration for measuring impedances of an example interchange impedance-compensated ultrasonic interface.

FIG. 4 is a schematic diagram of example switching sequences in a first calibration configuration for measuring impedances of an example interchange impedance-compensated ultrasonic interface. The first calibration configuration 400 is a configuration such as the first calibration configuration 200-A, described hereinabove. The switches S401, S402, S403, S404, and S400 and the capacitor C400 can be switched in accordance with the switching sequences described hereinabove for the switches S301, S302, S303, S304, and S300 and the capacitor C300 respectively (as described hereinabove with respect to FIG. 3).

In state 410, a current path 401 is opened in response to closing switches S400 (e.g., in response to pulse 311) and S401 (e.g., in response to pulse 312). The current path 401 generates a first charge on the capacitor C400 during a first interval (e.g., which is during the assertion of pulses 311 and 312). The first charge is developed in response to coupling a first-driver output node (e.g., node V1 of driver 220) to a first terminal of the capacitor C400 during the first interval, and in response to coupling a common mode voltage to a second terminal of the capacitor C400.

In state 420 (e.g., which is subsequent to the first interval of state 410), a current path 402 is opened in response to closing switch S402 (e.g., in response to pulse 313), which normalizes the first charge with respect to first (e.g., high-side) power rail. The current path 402 generates an indication of the voltage between the first terminal and the second terminal of a first-driver first-rail output transistor (e.g., voltage drain-to-source of transistor M221).

In state 430, a current path 403 is opened in response to closing switches S400 (e.g., in response to pulse 321) and S403 (e.g., in response to pulse 323). The current path 403 generates a first charge on the capacitor C400 during a first interval (e.g., which is during the assertion of pulses 321 and 323). The first charge is developed in response to coupling a second (e.g., low-side) power rail to the first terminal of the capacitor C400 during the first interval, and in response to coupling the common mode voltage to the second terminal of the capacitor C400.

In state 440 (e.g., which is subsequent to the first interval of state 430), a current path 404 is opened in response to closing switch S404 (e.g., in response to pulse 324, which normalizes the first charge with respect to a second-driver output node (e.g., node V0 of driver 210). The current path 404 generates an indication of the voltage between the first terminal and the second terminal of a second-driver second-rail output transistor (e.g., voltage drain-to-source of transistor M212).

Figure 5:
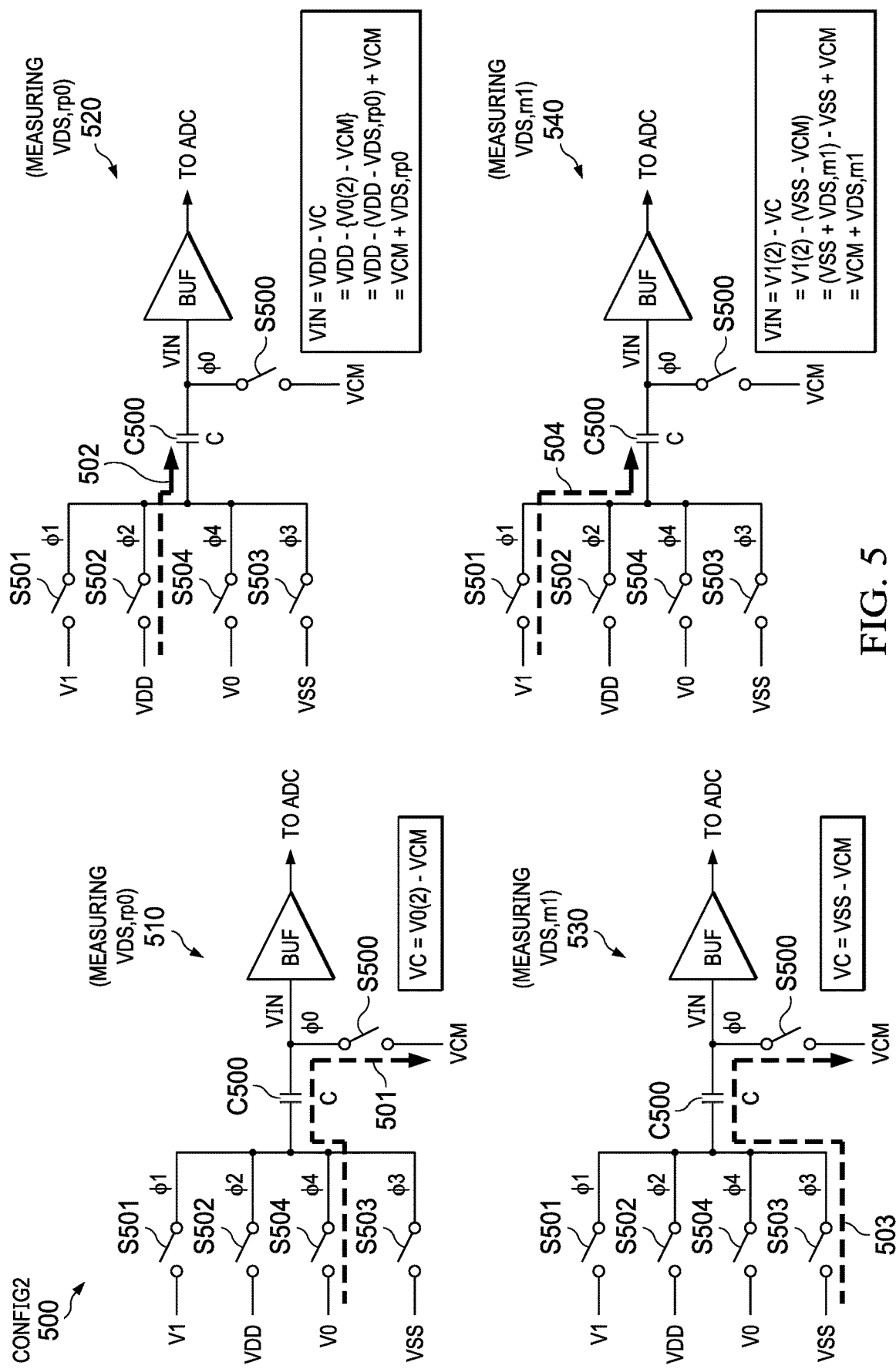
FIG. 5 is a schematic diagram of example switching sequences in a second calibration configuration for measuring impedances of an example interchange impedance-compensated ultrasonic interface.

FIG. 5 is a schematic diagram of example switching sequences in a second calibration configuration for measuring impedances of an example interchange impedance-compensated ultrasonic interface. The second calibration configuration 500 is a configuration such as the second calibration configuration 200-B, described hereinabove. The switches S501, S502, S503, S504, and S500 and the capacitor C500 can be switched in accordance with the switching sequences described hereinabove for the switches S301, S302, S303, S304, and S300 and the capacitor C300 respectively (as described hereinabove with respect to FIG. 3).

In state 510, a current path 501 is opened in response to closing switches S500 (e.g., in response to pulse 311) and S504 (e.g., in response to pulse 333). The current path 501 generates a first charge on the capacitor C500 during a first interval (e.g., which is during the assertion of pulses 331 and 333). The first charge is developed in response to coupling a second-driver output node (e.g., node V0 of driver 210) to a first terminal of the capacitor C500 during the first interval, and in response to coupling a common mode voltage to a second terminal of the capacitor C500.

In state 520 (e.g., which is subsequent to the first interval of state 510), a current path 502 is opened in response to closing switch S502 (e.g., in response to pulse 332), which normalizes the first charge with respect to first (e.g., high-side) power rail. The current path 502 generates an indication of the voltage between the first terminal and the second terminal of a second-driver first-rail output transistor (e.g., voltage drain-to-source of transistor M211).

In state 530, a current path 503 is opened in response to closing switches S500 (e.g., in response to pulse 341) and S503 (e.g., in response to pulse 343). The current path 503 generates a first charge on the capacitor C500 during a first interval (e.g., which is during the assertion of pulses 341 and 343). The first charge is developed in response to coupling a second (e.g., low-side) power rail to the first terminal of the capacitor C500 during the first interval, and in response to coupling the common mode voltage to the second terminal of the capacitor C500.

In state 540 (e.g., which is subsequent to the first interval of state 530), a current path 504 is opened in response to closing switch S501 (e.g., in response to pulse 342, which normalizes the first charge with respect to the first-driver output node (e.g., node V1 of driver 220). The current path 504 generates an indication of the voltage between the first terminal and the second terminal of a first-driver second-rail output transistor (e.g., voltage drain-to-source of transistor M222).

Figure 6:
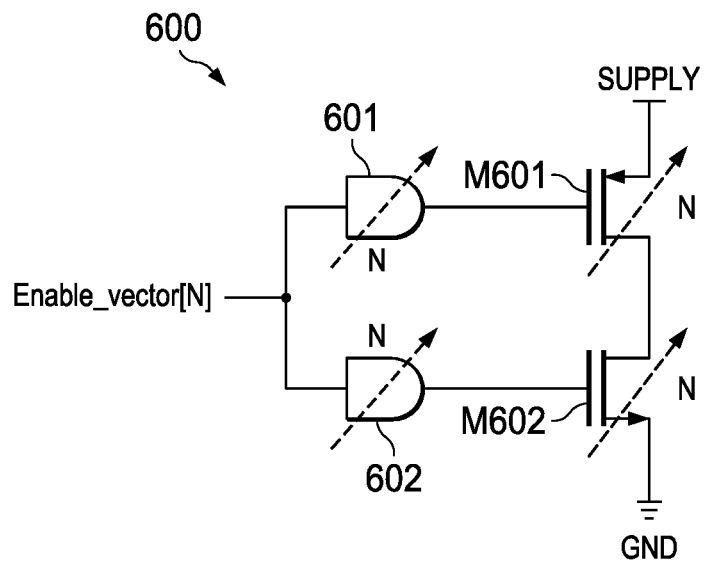
FIG. 6 is a schematic diagram of an example programmable driver of an example interchange impedance-compensated ultrasonic interface.

FIG. 6 is a schematic diagram of an example programmable driver of an example interchange impedance-compensated ultrasonic interface. For example, the driver 600 includes gate-drivers 601 and 602, a high-side (e.g., PMOS) transistor M601, and a low-side (e.g., NMOS) transistor M602. The driver 600 can be a driver such as the PHY0 and/or PHY1 driver described hereinabove.

The gate-driver 601 is arranged to receive a programmable value (e.g., Enable_vector[N]) and assert output control signals for activating selected gates within the high-side transistor M601. In a similar manner, the gate-driver 602 is arranged to receive a programmable value and assert output control signals for activating selected gates within the low-side transistor 602. For example, each of the high-side transistor M601 and the low-side transistor M602 is a programmable drive-strength output transistor.

The programmable value can be received from a processor, such as the state machine 190. The processor is arranged to perform a calibration process (such as described hereinbelow with respect to FIG. 7) for equalizing output impedances of the output transistors M601 and M602. The processor is arranged to receive an indication of the drive strength of each of the output transistors M601 and M602 (e.g., which are instantiated in each of the PHY0 and PHY1 drivers) and to adjust the drive strength (e.g., by activating selected transistor fingers) of the output transistors M601 and M602 in response to the respective indicated values.

The programmable output transistors M601 and M602 each can include a number N (e.g., 30) of individually selectable transistor fingers. The individually selectable transistor fingers include gate fingers, such that commonly-coupled sources and commonly-coupled drains of the programmable transistor are arranged between individually selectable gate fingers. Accordingly, the fingers of a programmable output transistor can be individually activated to drive a given load.

Each output transistor finger can be selectively activated by a respective enable vector (Enable_vector[N]). The value of an enable vector can be generated in response to measuring an output voltage generated by the respective output transistor being calibrated. Accordingly, the output impedance of each output transistor can be measured and the output impedance of each driver can be adjusted in response to the measurement of the respective transistor.

Figure 7:
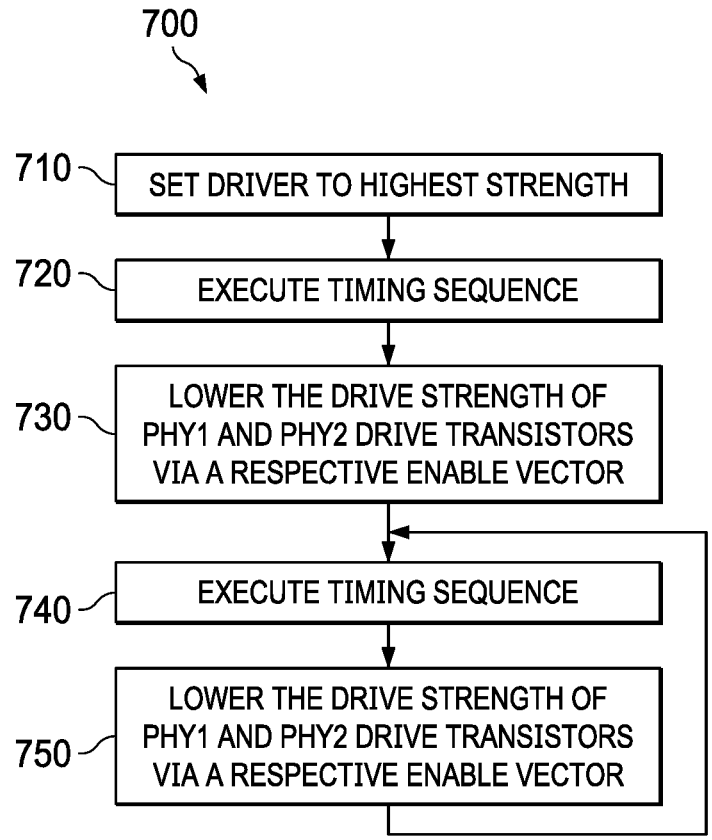
FIG. 7 is a flow diagram of an example process for calibrating an example interchange impedance-compensated ultrasonic interface.

FIG. 7 is a flow diagram of an example process for calibrating an example interchange impedance-compensated ultrasonic interface. The described program flow can be controlled by discrete logic circuits, state machines, and/or general processors executing instructions for converting the general processor into a special purpose machine for performing output transistor calibrations. The program flow can be executed by a single processor or multiple processors, and need not be performed in the order described hereinbelow. For example, each of four transistors can be calibrated in various permutations of the example sequences described hereinabove with respect to FIG. 3. The example program flow 700 begins with reference to operation 710.

In operation 710, a gate driver is set to a highest strength for testing a programmable output transistor. For example, all four output transistors of the PHY0 and PHY1 drivers can be set to a highest strength, such that all output fingers of each transistor are activated when each respective transistor is activated as described hereinabove with respect to FIG. 4 or FIG. 5 for calibration. The program flow continues with operation 720.

In operation 720, a timing sequence is executed for calibrating the output transistors. For example, a switched capacitor is switched in accordance with sequences described hereinabove with respect to FIG. 3, such that an indication of the voltage drain-to-source of each output transistor is respectively measured. An impedance of a (e.g., lowest voltage drain-to-source) particular transistor can be selected as a reference target for matching the drive strengths (e.g., for generating matching selected voltages drain-to-source) of each of the other output transistors. The program flow continues with operation 730.

In operation 730, the drive strength is lowered for each transistor that exceeds the reference target voltage (e.g., voltage drain-to-source). For example, the drive strength of each output transistor that exceeds the reference target voltage can lowered by decrementing the respective enable vector that programs the respective (e.g., non-matching) output transistor. The decremented enable vector reduces the number of activated fingers in the output transistors (e.g., such that the non-matching output transistor outputs can be lowered to match the reference target voltage). The program flow continues with operation 740.

In operation 740, the timing sequence is executed for calibrating the output transistors. For example, the timing sequence described hereinabove with respect to FIG. 3, such that an indication of the voltage drain-to-source of each output transistor is individually measured. The program flow continues with operation 750.

In operation 750, the drive strength of each transistor exceeding the reference target voltage drain-to-source is lowered. For example, the drive strength of an output transistor that exceeds the reference target voltage drain-to-source can lowered by decrementing (e.g., from a previously decremented value) the respective enable vector. Decrementing the enable vector reduces the number of activated fingers in the (e.g., non-matching) output transistor, which further lowers the drive strength of the output transistor. The program flow continues by iterating operations 740 and 750 until the drive strength of each output transistor matches the drive strengths of the other output transistors.

In another example, the operation 700 can be executed such that the drive strengths of the high-side transistors of the PHY0 and PHY1 drivers are matched to each other, and such that the drive strengths of the low-side transistors of the PHY0 and PHY1 drivers are matched to each other.

Figure 8:
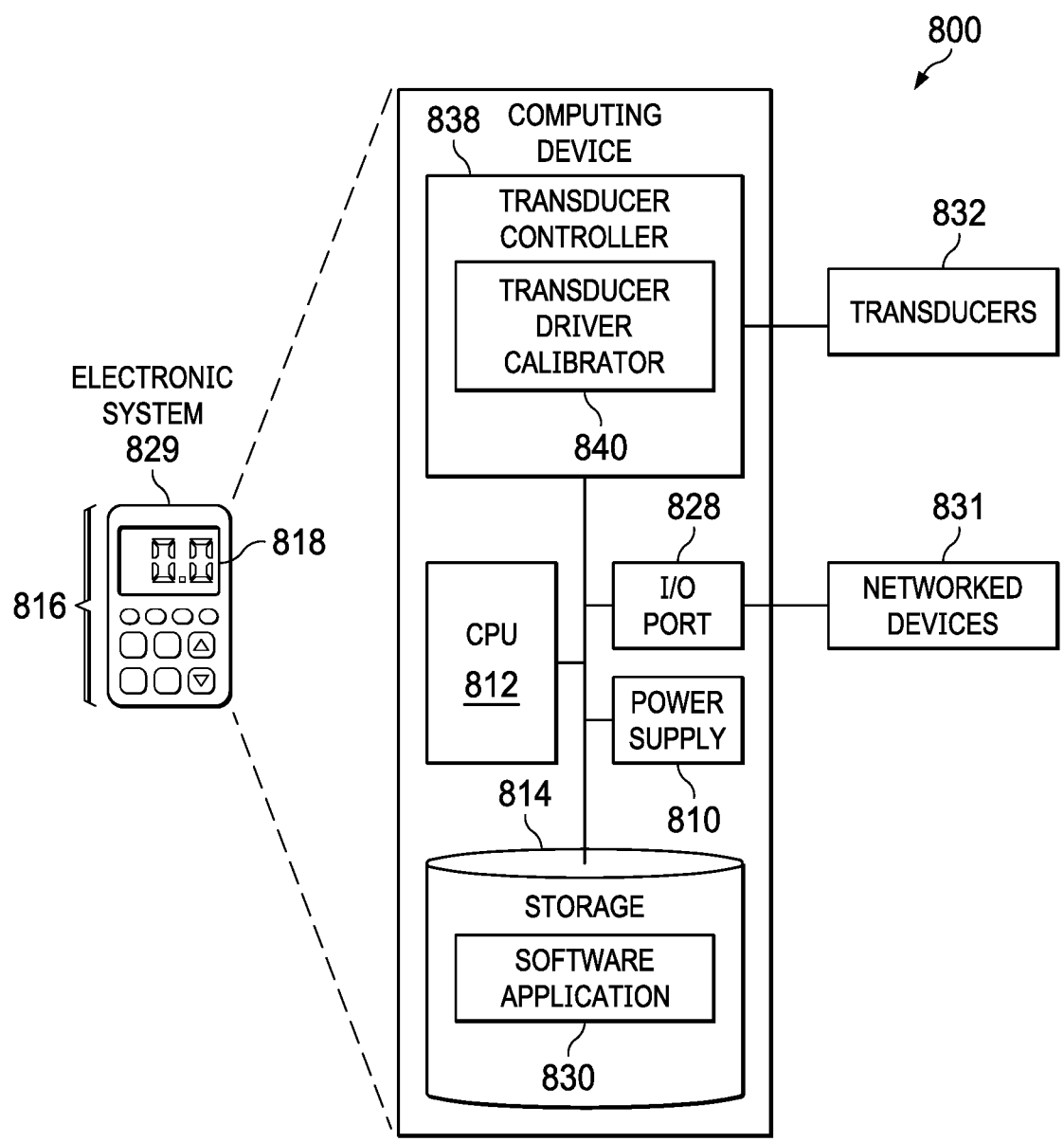
FIG. 8 is a block diagram of a computing device that includes an example interchange impedance-compensated ultrasonic interface.

FIG. 8 is a block diagram of a computing device 800 that includes an example interchange impedance-compensated ultrasonic interface. For example, the computing device 800 is, or is incorporated into, or is coupled (e.g., connected) to an electronic system 829, such as a computer, electronics control "box" or display, communications equipment (including transmitters or receivers), or any type of electronic system operable to process information.

In some examples, the computing device 800 includes a megacell or a system-on-chip (SoC) that includes control logic such as a CPU 812 (Central Processing Unit), a storage 814 (e.g., random access memory (RAM)) and a power supply 810. The CPU 812 can be, for example, a CISC-type (Complex Instruction Set Computer) CPU, RISC-type CPU (Reduced Instruction Set Computer), MCU-type (Microcontroller Unit), or a digital signal processor (DSP). The storage 814 (which can be memory such as on-processor cache, off-processor cache, RAM, flash memory, or disk storage) stores one or more software applications 830 (e.g., embedded applications) that, when executed by the CPU 812, perform any suitable function associated with the computing device 800. The processor is arranged to execute code for transforming the processor into a special-purpose machine having the structures—and for performing the operations— described herein.

The CPU 812 comprises memory and logic that store information frequently accessed from the storage 814. The computing device 800 can be controlled by a user operating a UI (user interface) 816, which provides output to and receives input from the user during the execution the software application 830. The output can include indicators such as the display 818, indicator lights, a speaker, and vibrations. The input can include sensors for receiving audio and/or light (using, for example, voice or image recognition), and can include electrical and/or mechanical devices such as keypads, switches, proximity detectors, gyros, and accelerometers.

The CPU 812 and power supply 810 can be coupled to I/O (Input-Output) port 828, which provides an interface that is configured to receive input from (and/or provide output to) networked devices 831. The networked devices 831 can include any device (including test equipment) capable of point-to-point and/or networked communications with the computing device 800. The computing device 800 can be coupled to peripherals and/or computing devices, including tangible, non-transitory media (such as flash memory) and/or cabled or wireless media. These and other such input and output devices can be selectively coupled to the computing device 800 by external devices using wireless or cabled connections. The storage 814 is accessible, for example, by the networked devices 831. The CPU 812, storage 814, and the power supply 810 are also optionally coupled to an external power source (not shown), which is configured to receive power from a power source (such as a battery, solar cell, "live" power cord, inductive field, fuel cell, capacitor, and energy storage devices).

The power supply 810 includes power generating and control components for generating power to energize the computing device 800 to execute the software application 830. The power supply 810 is optionally included in the same physical assembly as computing device 800, or alternatively coupled to computing device 800. The computing device 800 optionally operates in various power-saving modes in which individual voltages are supplied (and/or turned off) in accordance with a selected power-saving mode and the various components thereof being arranged within a selected power domain.

The example transducer controller 840 (which is a controller such as the example interchange impedance-compensated ultrasonic interface 100, described hereinabove with respect to FIG. 1) is arranged to control the transducers 832. The transducers 832 are arranged to transmit sound waves (via a first transducer) and to receive the sound waves that are propagated through a transmission medium (via a second transducer). The roles of the first and second transducers can be interchanged.

The CPU 812 is arranged to determine characteristics (e.g., speed and direction) of the transmission medium in response to information received from the transducers 832. The transducer controller 840 also includes the transducer driver calibrator, which is arranged to match impedances of the drivers arranged to control the transducers 832. Calibrating the transducer drivers enhances the accuracy of the characteristics determined for the transmission medium.

Modifications are possible in the described examples, and other examples are possible, within the scope of the claims.

What is claimed is:

1. A circuit, comprising:
   a first driver that includes a first transistor, a second transistor, and an output node, the first transistor including a first terminal and a second terminal and the second transistor including a first terminal and a second terminal, wherein the first terminal of the first transistor is adapted to be coupled to a first power rail, the first terminal of the second transistor is adapted to be coupled to a second power rail, the second terminal of the first transistor is coupled to the output node of the first driver, and the second terminal of the second transistor is coupled to the output node of the first driver;
   an impedance component including a first terminal and a second terminal, the first terminal of the impedance component coupled to the output node of the first driver;
   a second driver that includes a third transistor, a fourth transistor, and an output node, the third transistor including a first terminal and a second terminal, the fourth transistor including a first terminal and a second terminal, wherein the first terminal of the third transistor is adapted to be coupled to the first power rail, the first terminal of the fourth transistor is adapted to be coupled to the second power rail, the second terminal of the third transistor is coupled to the output node of the second driver, the second terminal of the fourth transistor is coupled to the output node of the second driver, and the output node of the second driver is coupled to the second terminal of the impedance component;
   a sampling circuit arranged to sample voltages generated at the first and second terminals of the impedance component; and
   a processor, coupled to the sampling circuit, and arranged to:
      determine, from the sampled voltages, impedances of the first transistor of the first driver, the second transistor of the first driver, the third transistor of the second driver, and the fourth transistor of the second driver; and
      adjust a drive strength of at least one of the transistors in response to the determined impedances.

2. The circuit of claim 1, wherein the first and second drivers and the sampling circuit are formed on a common substrate.

3. The circuit of claim 1, wherein the impedance component is a resistor.

4. A circuit, comprising:
a first driver that includes a first transistor, a second transistor, and an output node, the first transistor including a first terminal and a second terminal, the second transistor including a first terminal and a second terminal, wherein the first terminal of the first transistor is adapted to be coupled to a first power rail, the first terminal of the second transistor is adapted to be coupled to a second power rail, the second terminal of the first transistor is coupled to the output node of the first driver, and the second terminal of the second transistor is coupled to the output node of the first driver;
an impedance component including a first terminal and a second terminal, the first terminal of the impedance component coupled to the output node of the first driver;
a second driver that includes a third transistor, a fourth transistor, and an output node, the third transistor including a first terminal and a second terminal, the fourth transistor including a first terminal and a second terminal, wherein the first terminal of the third transistor is adapted to be coupled to the first power rail, the first terminal of the fourth transistor is adapted to be coupled to the second power rail, the second terminal of the third transistor is coupled to the output node of the second driver, the second terminal of the fourth transistor is coupled to the output node of the second driver, and the output node of the second driver is coupled to the second terminal of the impedance component;
a sampling circuit arranged to sample a sampled voltage generated at least one of the first and second terminals of the impedance component;
wherein the sampling circuit is arranged to:
generate an indication of a voltage between the first terminal and the second terminal of the first transistor of the first driver during a first interval; and
generate the indication of a voltage between the first terminal and the second terminal of the first transistor of the first driver during a second interval subsequent to the first interval; and
a controller arranged to adjust a drive strength of the first transistor in response to the indication of a voltage between the first terminal and the second terminal of the first transistor of the first driver.

5. The circuit of claim 4, wherein a terminal of a sampling capacitor is coupled to an input of an analog-to-digital converter (ADC).

6. The circuit of claim 5, comprising a first transducer coupled to the output node of the first driver, and comprising a second transducer coupled to the output node of the second driver.

7. The circuit of claim 5, wherein the first transducer is arranged to transmit a signal, and wherein the second transducer is arranged to receive the transmitted signal.

8. A system, comprising:
a first driver that includes a first transistor, a second transistor, and an output node, the first transistor including a first terminal and a second terminal, the second transistor including a first terminal and a second terminal, wherein the first terminal of the first transistor is adapted to be coupled to a first power rail, the first terminal of the second transistor is adapted to be coupled to a second power rail, the second terminal of the first transistor is coupled to the output node of the first driver, and the second terminal of the second transistor is coupled to the output node of the first driver;
an impedance component including a first terminal selectively coupled to the output node of the first driver;
a second driver that includes a third transistor, a fourth transistor, and an output node, the third transistor including a first terminal and a second terminal, the fourth transistor including a first terminal and a second terminal, wherein the first terminal of the third transistor is adapted to be coupled to the first power rail, the first terminal of the fourth transistor is adapted to be coupled to the second power rail, the second terminal of the third transistor is coupled to the output node of the second driver, the second terminal of the fourth transistor is coupled to the output node of the second driver, and the output node of the second driver is coupled to the second terminal of the impedance component;
a sampling circuit arranged to generate an indication of an impedance of each of the first transistor of the first driver, the second transistor of the first driver, the third transistor of the second driver, and the fourth transistor of the second driver; and
a processor for altering, in response to the indications of impedances, output impedances of each of the first transistor of the first driver, the second transistor of the first driver, the third transistor of the second driver, and the fourth transistor of the second driver.

9. The system of claim 8, further comprising an analog-to-digital converter (ADC) coupled to the sample circuit.

10. The system of claim 9, wherein the processor is configured to program the output impedances in response to the digital samples.

11. The system of claim 10, comprising a first transducer coupled to the output node of the first driver and comprising a second transducer coupled to the output node of the second driver, wherein the first transducer is arranged to transmit a signal and wherein the second transducer is arranged to receive the transmitted signal to determine a time of flight of the transmitted signal from the first transducer to the second transducer.

12. The system of claim 11, wherein the transmitted signal is a first transmitted signal and the second transducer is arranged to transmit a second signal and wherein the first transducer is arranged to receive the transmitted second signal to determine a time of flight of the second transmitted signal from the second transducer to the first transducer, and wherein the processor is arranged to determine a speed for the time of flight of the first transmitted signal from the first transducer to the second transducer and in response to the time of flight of the second transmitted signal from the second transducer to the first transducer.

13. A method, comprising:
selectively coupling a first terminal of a resistive load to an output node of a first driver, wherein the output node of the first driver is coupled to output-current terminals of first and second output-transistors of the first driver, wherein the first output transistor of the first driver includes an input-current terminal coupled to a first power rail, and wherein the second output transistor of the first driver includes an input-current terminal coupled to a second power rail;
selectively coupling a second terminal of the resistive load to an output node of a second driver, wherein the output node of the second driver is coupled to output-current terminals of first and second output-transistors of the second driver, wherein the first output transistor of the second driver includes an input-current terminal coupled to the first power rail, and wherein the second output transistor of the second driver includes an input-current terminal coupled to the second power rail;

while coupling the first and second terminals of the resistive load to the output nodes of the first and second drivers, respectively, turning on the first output transistor of the first driver and the second output transistor of the second driver and turning off the second output transistor of the first driver and the first output transistor of the second driver to generate a first configuration current across the resistive load, and sampling voltages at the first and second terminals of the resistive load;

then, while coupling the first and second terminals of the resistive load to the output nodes of the first and second drivers, respectively, turning on the first output transistor of the second driver and the second output transistor of the first driver and turning off the first output transistor of the first driver and the second output transistor of the second driver to generate a second configuration current across the resistive load, and sampling voltages at the first and second terminals of the resistive load; and adjusting a drive strength of at least one of the first output transistor of the first driver, the second output transistor of the first driver, the first output transistor of the second driver, and the second output transistor of the second driver in response to the sampled voltages during the generating of the first configuration current and the second configuration current.

14. The method of claim 13, further comprising:

turning on the first output transistor of the first driver to drive a first transducer to transmit a signal across a medium;

turning on the second output transistor of the second driver to drive a second transducer to receive the signal transmitted by the first transducer; and determining a time of flight of the transmitted signal from the first transducer to the second transducer.

15. The method of claim 14, further comprising:

turning on the first output transistor of the second driver to drive the second transducer to transmit a signal across the medium;

turning on the second output transistor of the first driver to drive the first transducer to receive the signal transmitted from the second transducer;

determining a time of flight of the transmitted signal from the second transducer to the first transducer; and determining a speed of the medium in response to the time of flight of the transmitted signal from the first transducer to the second transducer and in response to the time of flight of the transmitted signal from the second transducer to the first transducer.

* * * * *